United States Patent [19]
Lind

[11] Patent Number: 4,928,067
[45] Date of Patent: May 22, 1990

[54] NON-INTRUSIVE FIBER OPTIC ELECTROMAGNETIC FIELD PROBE APPARATUS AND ASSOCIATED METHODS

[75] Inventor: Paul U. Lind, Phoenix, Ariz.

[73] Assignee: Siemens Transmission Systems, Inc., Phoenix, Ariz.

[21] Appl. No.: 286,545

[22] Filed: Dec. 19, 1988

[51] Int. Cl.$^5$ .............................................. G01R 33/12
[52] U.S. Cl. ................................. 324/96; 250/227.11; 250/551
[58] Field of Search .................... 324/72, 96, 457; 250/227; 455/613, 617

[56] References Cited

U.S. PATENT DOCUMENTS

| | | | |
|---|---|---|---|
| 4,032,843 | 6/1977 | Loucks | 324/96 |
| 4,147,977 | 4/1979 | Dimmick | 324/121 |
| 4,502,937 | 3/1985 | Yagi | 324/96 |
| 4,516,073 | 5/1985 | Doriath et al. | 324/244 |
| 4,533,829 | 8/1985 | Miceli et al. | 324/96 |
| 4,542,338 | 9/1985 | Arditty et al. | 324/117 |
| 4,571,691 | 2/1986 | Kennon | 364/483 |
| 4,642,559 | 2/1987 | Slough | 324/72 |
| 4,750,216 | 6/1988 | Boyce | 455/617 |

FOREIGN PATENT DOCUMENTS

| | | | |
|---|---|---|---|
| 55-82967 | 6/1980 | Japan | 324/97 |
| 87/02769 | 5/1987 | World Int. Prop. O. | |

Primary Examiner—Reinhard J. Eisenzopf
Assistant Examiner—Edward Urban
Attorney, Agent, or Firm—Jeffrey P. Morris

[57] ABSTRACT

A probe tip is employed to measure electromagnetic fields without the use of a metallic conducting wire or cable which would otherwise distort the field being measured. The probe tip includes a variety of different circuits, each of which contains a separate battery, a powered field measurement sensor and an amplifier. A light source, which is internal to the probe tip and coupled to the amplifier, operates to convert the measured field to an analog optical signal. The analog optical signal is transmitted via an optical fiber to a receiver/preamplifier circuit which converts the optical signal to an electrical signal at the fiber's far end. This receiver/preamplifier device can be coupled directly to an oscilloscope or other instrument which are employed and used for the display or recording the magnitude of the electromagnetic field as measured by the probe.

14 Claims, 2 Drawing Sheets

NON-INTRUSIVE FIBER OPTIC ELECTROMAGNETIC FIELD PROBE APPARATUS AND ASSOCIATED METHODS

This invention relates to a fiber optic electromagnetic field probe and more particularly to the use of such a probe in measurement of electromagnetic fields.

BACKGROUND OF THE INVENTION

The electric and magnetic components of an electromagnetic field are normally measured by extremely small probes which are connected by a coaxial cable to a measuring device such as a meter, an oscilloscope or other device.

A short linear antenna is used for electric fields and a small wire loop having one or more turns is used to measure magnetic fields. The very presence of the probe or particularly a large metallic cable operates to distort the field. To complicate matters further, the connecting cable can accommodate foreign fields which are directed to the measurement area because of its metallic nature and because it operates as, for example, a pick-up antenna. In regard to this, severe field disturbances occur when one tries to employ a conventional probe to measure fields inside electronic equipment which are caused by external electrostatic discharges.

As one can ascertain, a common design problem involves trying to prevent such discharges from disrupting the delicate electronics inside a reasonably shielded enclosure. Thus, any metallic wire which enters such an enclosure represents a breach through which external fields can enter and fields enter quite easily on a conductive wire. The design problem then often involves special grounding treatment of each wire entering the enclosure. Unfortunately, attempts to measure fields inside such an enclosure compound the problem by coupling more of the undesirable fields to the inside of the enclosure along the probe connection.

For an example of the problem, the following is applicable. In regard to modern telephone communications systems a common requirement is that the telephone equipment be able to withstand electrostatic discharges without damage and with a minimum of disruption. There are many definitive documents which specify that such equipment must be relatively immune to electrostatic discharge.

As one can ascertain from such documents, they define a human body model for discharge and specify various severe levels with 15,000 volts of electrostatic discharge being the highest. Thus a goal has been to design telephone systems which can withstand that level of discharge with no damage and a minimum of logic disruption. As one can ascertain, modern telephone systems are relatively complex and many employ central control logic as well as distributed control logic where microprocessors are widely employed, including extensive logic circuitry which is coupled and operates in conjunction with such microprocessors. The operators console associated with such systems serves as a control for the switching system and contains complicated electronic assemblies.

In regard to such consoles, one can understand that the equipment utilized therein is subject to numerous static discharges, especially when used in carpeted areas. One can also ascertain that normal logic circuitry is very sensitive to these discharges. Hence, one must immunize the logic as well as the housings containing the logic as is apparent. In any event, it is extremely difficult to know what the electric field strength is inside such a housing because logic disruption problems, as indicated above, are caused by wires or cables coupled to the units which act as antennas bringing the external discharge field into the cabinet or the housing. In this manner, any probe wire would have compounded the original problem due to the fact that a probe wire itself acts as an antenna.

There is therefore an obvious need to measure or monitor the fields inside a partially shielded enclosure and once the fields are measured then one, of course, could deal with the problem and provide immunity in regard to that problem. The prior art was of course aware of the fact that such fields had to be measured.

In regard to some of the prior art, reference is made to U.S. Pat. No. 4,542,338 entitled "Optical Fiber Interferometric Electric Current Measuring Device" issued on Sept. 17, 1985 to H. Arditty et al. This patent discloses a device which uses the Faraday magneto optic effect to measure strong electrical or magnetic fields. Such devices are used to measure fields at a remote location while providing isolation. The device employs a winding which is traversed by a feedback current and includes an interferometer core, a feed back winding, an insulating member and a measuring head which are mounted on a conductor which is traversed by the current to be measured. The insulating member is a rigid member forming a support or a tubular insulating member having a flexible wall and provided with skirts made from an insulating material having a profile similar to that of a water droplet.

See also, U.S. Pat. No. 4,516,073 entitled "Magnetometer Probe Using A Thin Film Magnetic Material As A Magneto Optic Sensor" issued on May 7, 1985 to G. Doriath et al. This patent shows a measuring device which is divided into two separate sub units including a first sub unit which has means for transmission and detection of polarized light and which is coupled via a fiber to a second sub unit comprising a thin layer of magnetic material within which is guided the light transmitted by the fiber. The coupling with the fiber is established at the edge with the opposed end of the layer being provided with a mirror so that the guided wave follows an outgoing and returning path before being retransmitted to the detection means which then operates to measure the rotation of the polarization of the light which is caused by the Faraday effect. Essentially this is another device using the Faraday magneto-optic effect to measure fields.

U.S. Pat. No. 4,032,843 entitled "Compensated Signal Isolator" issued on June 28, 1977 to R. S. Loucks. This patent describes a device for coupling a signal value out of a circuit which is floating at some relatively high voltage. There is shown a sensor for converting the parameter to be measured to a signal voltage together with an amplifier and light emitting diode which are powered by a floating power supply of minimum power rating. An optical fiber link, which provides electrical isolation, joins the LED with a solid state light to electric transducer at a remote location. There is shown circuit means responsive to the light to electric transducer for outputting an analog value representative of the quantity to be measured at the point of a common mode voltage. This LED fiber optic link and light to electric transducer constitute a first optically coupled isolator. An additional isolator having the same characteristics as the first is located at the remote location and includes a second LED which is linked to the first via an optical fiber and includes a second light to electric transducer which generates a signal representative only of the extraneous variations produced through the first isolator. The resulting signal is differentially added as a feedback term to the signal produced by the first optical isolator device to provide a compensated analog output signal.

See also, PCT U.S. 86/02218 International Publication No. WO87/02769 entitled "Fiber Optic Sensing of Temperature and/or Other Physical Parameters", published on May 7, 1987 to H. Sun et al. Essentially, this describes probes which utilize direct optical effects for remote sensing of temperature and other parameters. Particularly, a special temperature sensitive luminescent phosphor is coated on the fiber. The phosphor temperature can then be deduced from the emitted wave lengths. As indicated, the probes provide isolation of high voltages and reduction of the dangers associated with discharge, such as explosion, when using wires.

In any event, as one can ascertain from the prior art, there is a definite need to provide a probe which can convey electromagnetic field information across a shielded boundary without using electrically conductive wires.

It is a further object of the present invention to provide apparatus and methods of using an optical signal to carry field strength information which apparatus utilizes interchangeable probe tips for measuring specific types of field disturbances.

SUMMARY OF THE INVENTION

A field probe apparatus for measuring electromagnetic fields generated within shielded enclosures and operative to minimumly disturb said fields, comprising, a sensing conductor means and associated amplifier to be inserted into said enclosure at one end to provide a signal indicative of electromagnetic field strength, said amplifier means having an input coupled to said conductor means at said other end and operative to provide a voltage to current conversion gain at an output, a light emitting device coupled to said amplifier output to provide a light signal according to the signal produced on said sensing conductor means, an optical fiber cable having a first end positioned to receive said light from said emitting device to transport said light out of the measurement area to a second end of said fiber.

DETAILED DESCRIPTION OF THE FIGURES

Figure 1:
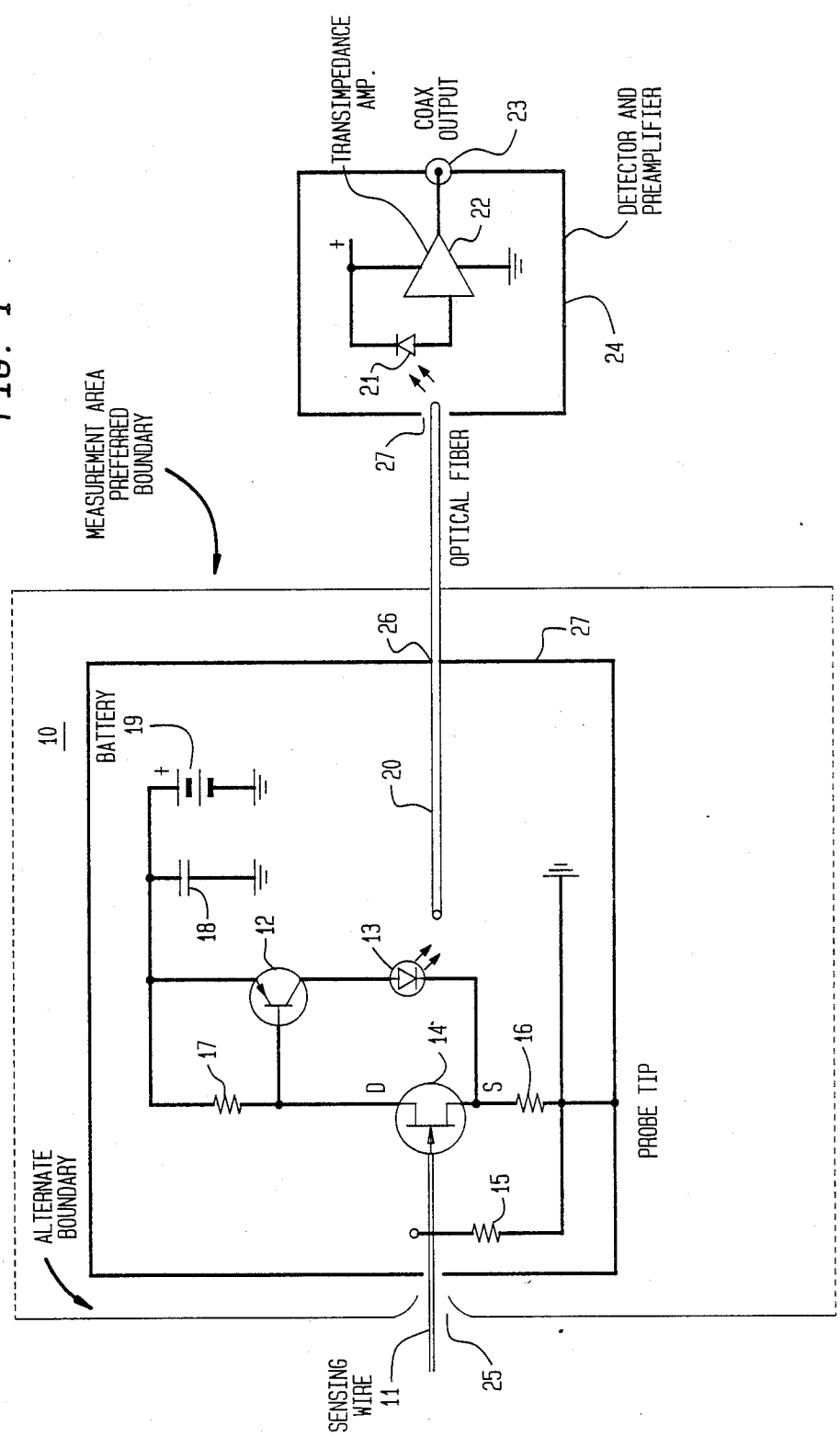
FIG. 1 is a detailed schematic diagram showing an electromagnetic field probe employing an electric field measuring probe tip which is particularly suited for measuring the effect of electric fields on MOS devices in their operating environments.

Referring to FIG. 1, there is shown a probe 10 which is utilized with an electric field measuring tip. As can be seen from FIG. 1, a sensing wire 11 is coupled to the gate electrode of a field effect transistor (FET) 14. The field effect transistor is a conventional device and has an extremely high input impedance and is shown as an N channel device. In the preferred embodiment, the entire probe 10, which is of small size, is inserted in the measurement area, often a shielded enclosure, with only optical fiber 20 crossing the boundary into that measurement area. Alternatively, the sensing wire 11 has one end for insertion into a shielded measurement area and its other end directed through an input port 25 contained in the side of a shielded housing 27. In this second case, port 25 must be tightly coupled to the enclosed measurement area and enclosure 10 must provide good shielding to avoid the aforementioned problem of field energy leakage into the measurement area via wires.

The source electrode of the FET 14 is coupled to a point of reference potential via a resistor 16. The gate electrode is also coupled to the point of reference potential by an input resistor 15. The drain electrode of the field effect device 14 is coupled to the base electrode of a PNP transistor 12. The emitter electrode of the PNP transistor is coupled to a source of operating potential as a battery 19. A capacitor 18 serves as a filter capacitor and is directed between the positive terminal of the battery and the point of reference potential.

The biasing for the base electrode of transistor 12 is accommodated by means of resistor 17. The collector electrode of the transistor 12 is connected to the source electrode of the FET 14 via an LED device or light emitting diode 13. The anode of LED 13 is connected to the collector electrode of the PNP transistor 12 with the cathode connected to the source electrode to the FET 14. The diode 13, when energized, illuminates, as is well known and provides an optical signal which is directed to one end of an optical fiber 20. The fiber 20 is directed from the probe tip housing 10 via the port 26 to a detector and preamplifier circuit which is contained in a separate housing 24. The detector and preamplifier circuit consists of a PIN diode 21 which is directed to the input of a transimpedance amplifier 22. The output of the transimpedance amplifier 22 is directed to a coaxial output jack 23.

As one can ascertain, the CMOS simulating electric field tip, as shown in FIG. 1, employs the FET device which has an extremely high input impedance. The FET is a JFET as shown because these are more commonly available in discrete form but it is understood that a MOSFET could be employed as well. The field inside an enclosure is sensed by means of the sensing wire 11 which is about 2 inches long and is selectable by the user. In this manner the user can select any length of sensing wire he desires and which sensing wire couples to the gate electrode of the FET 14. The wire 11 serves to pick-up electromagnetic energy within the enclosure to be monitored.

As also ascertained, the resistance 15 is an extremely high resistance which biases the gate electrode of the FET 14. The FET 14 is connected in a bootstrap source follower arrangement with the PNP transistor 12 operating with high current gain.

As one can ascertain, the LED 13 is connected in series with the collector electrode of PNP transistor 12 so that the output current is directed through the LED device which output current is determined primarily by resistor 16 and the FET pinch off voltage. Resistor 17 is a speed up resistor. It is understood that the circuit is given by way of a particular example, the important fact being that the high impedance probe wire signal undergoes very high voltage to current conversion gain in the amplifier which drives the LED light source. In any event, it is also understood that other circuits may suffice as well as long as there is a high voltage to current gain and one may employ, for example, a transconductance amplifier or other device to implement the operations of the FET 14 and PNP transistor 12.

As indicated in FIG. 1, the optical fiber 20 carries the signal to the detector/preamplifier module 24. This circuit again may be built in a variety of ways, one of which uses a PIN diode 21 as a light detector which diode is coupled to the input of a transimpedance amplifier 22. These amplifiers are conventional and are available, for example, from the Signetics Corporation as the NE5212. The detector/preamplifier combination 24 is enclosed in a well-shielded module to avoid interference from nearby fields, particularly the field being measured.

Figure 2:
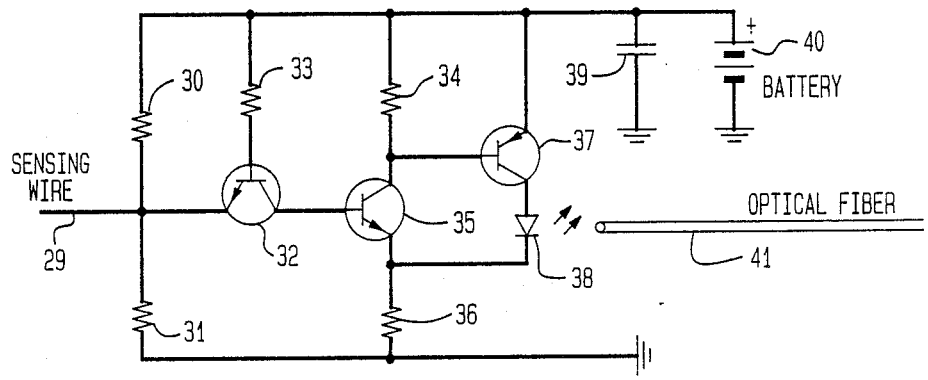
FIG. 2 is a detailed schematic diagram showing a field probe utilizing a TTL simulating tip.

Referring to FIG. 2 there is shown a schematic diagram of an alternative probe tip for simulating the effects of an electric field on, for example, a TTL (transistor-transistor-logic) gate. The sensing wire 29 is coupled to the emitter electrode of an NPN transistor 32. The emitter electrode is biased by means of a voltage divider consisting of resistors 30 and 31, the junction therebetween connected to one end of the sensing wire and the emitter electrode of transistor 32. The base electrode of transistor 32 is biased by means of resistor 33 which is directed to the positive terminal of the battery 40. The battery 40 is shunted by a capacitor 39 which serves as a filter capacitor. The collector electrode of transistor 32 is coupled to the base electrode of an NPN transistor 35. The emitter electrode of transistor 35 is directed to a point of reference potential through a resistor 36 while the collector electrode is directed through a load resistor 34 to the battery terminal. The collector electrode of transistor 35 is coupled to the base electrode of a PNP transistor 37 which has its emitter electrode connected to the positive supply terminal of battery 40 and which has its collector electrode coupled to the emitter electrode of transistor 35 via an LED device 38. The LED device again illuminates according to the field impressed upon the sensing wire 29 which illumination is directed via an optical fiber 41 to a detector and preamplifier device as for example shown in FIG. 1 by reference numeral 34.

The circuit again employs a bootstrap configuration which provides high current gain. The output LED light source carries the collector current from transistor 37 which flows through resistor 36 to stabilize the operating or biasing point. The resistor 34 is a speed up resistor. It is again understood that many different circuit configurations may be used to simulate a TTL input but the main objective of the invention is that the disturbing effect of a particular field on TTL circuits can be measured directly by using an amplifier which simulates that input.

Figure 3:
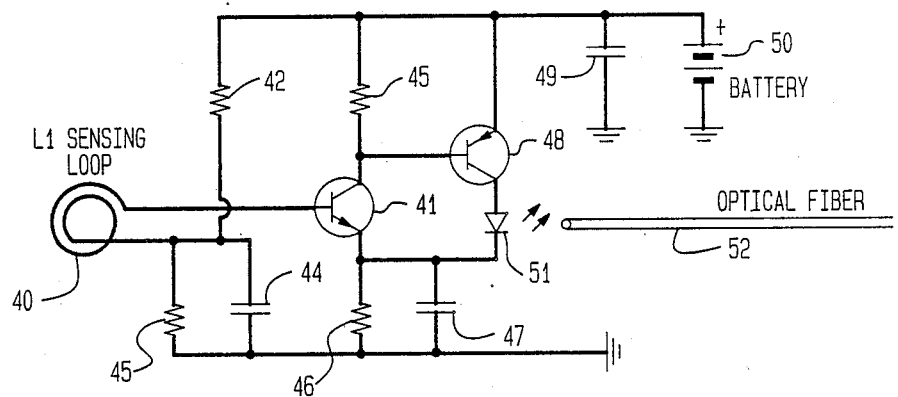
FIG. 3 is a schematic diagram showing a probe tip utilized to sense magnetic fields.

Referring to FIG. 3, there is shown a magnetic field sensing probe tip which can be employed as the probe tip 1 of FIG. 1. In the case of measuring a magnetic field, a sensing loop 40 is employed. One terminal of the sensing loop is directed to the base electrode of an NPN transistor 41. Transistor 41 has its emitter electrode coupled via a resistor 46 which is shunted by a capacitor 47 and directed to a point of reference potential. The other end of the sensing loop 40 is coupled to the point of reference potential via a resistor 43 which is shunted by means of capacitor 44. This terminal of the sensing loop is also directed via a resistor 42 to the positive terminal of a battery supply 50 which is bypassed by a filter capacitor 49.

The collector electrode of transistor 41 is directed to the source of voltage 50 via a collector resistor 45 with the collector electrode of transistor 41 being directly coupled to the base electrode of a PNP transistor 48. The transistor 48 has its emitter electrode coupled to the point of biasing potential and has its collector electrode coupled to the emitter electrode of transistor 41 via the LED 51. The LED 51 has the anode connected to the collector electrode of PNP 48 and the cathode connected to the emitter electrode of NPN 41. The LED illuminates the face of an optical fiber 52 which is directed at the other end to a detector and preamplifier as for example module 24 of FIG. 1. Again, the amplifier has a high current gain to amplify the small current induced in the sensing loop 40. As indicated, resistors 42 and 43 bias the transistor 41 which drives the PNP transistor 48.

The capacitor 44 provides a low impedance reference point for the sensing loop 40. The collector current of transistor 48 passes through the output LED 51 and through resistor 46 shunted by capacitor 47. The DC component of the current controls the bias on transistor 41 by negative feedback while the AC component passes directly through capacitor 47 so that the high frequency response of the amplifier remains high. Again, resistor 45 is a speed up resistor.

It should be understood that different amplifier configurations having high current gain could be employed for any of the probe tip circuits shown above. As one can ascertain from the above, the primary purpose of the above-described field probe is its ability to measure RF electromagnetic fields inside a shielded enclosure with minimum disturbance to those fields. The probe can be utilized when measuring the effectiveness of such a shield where a strong RF field gradient is placed across the shield. In such situations, any metallic probe wire which enters a shield can easily act as a transmission line or antenna which therefore disturbs the RF field inside the enclosure by conveying the external field to the inside. The use of coaxial cable probe wires only partially solves this problem.

The present structure, as indicated above, eliminates the problem of field disruption by allowing only a glass fiber to breach the shield. Thus the probe is referred to as a non-intrusive measuring device. The probe can be employed in many different situations. For example, it may be desirable to know the effect of a particular field on a CMOS gate having 1 inch of exposed wire on its input. An FET input tip is provided to make this specific measurement, as for example shown in FIG. 1. The device can easily be calibrated in terms of gate input voltage rather than the more cumbersome field strength units.

Alternatively, it may be desirable to measure the effect of a field on TTL logic inputs hence a specific probe tip is used to simulate a TTL input, as for example the circuit shown in FIG. 2. Furthermore, it may be that foreign magnetic fields are disturbing a low impedance circuit containing a closed magnetic circuit. Thus a magnetic loop sensor tip 40, as shown in FIG. 3, is provided for that measurement. Thus, the above-noted invention not only prevents foreign fields from entering the measurement area along a conductive cable, but it flexibly provides for different types of field measurements.

A particular interesting application involving the above-noted probes occurred in the testing of a power supply, which power supply was found to be extremely sensitive to ESD. This interference caused the supply to latch and essentially shut down the entire system. The power supply was surrounded by a shield. Since the leads in the power supply were not well treated, it was felt that external fields were entering and affecting the leads as well as the power supply circuit. Thus, it was desirable to measure the intensity of the electric field inside the enclosure when controlled electrostatic discharges were applied to the outside of the enclosure. At first a probe was employed using a few inches of wire protruding from a short length of RG/59 coaxial cable which was grounded to the oscilloscope. The shield of the coaxial cable was grounded to the supply enclosure so that the only signal in the coaxial cable would be due to the electric field inside the housing. This, in any event, was a very naive assumption and produced strange readings which resulted in the simple experiment of shorting the coaxial center conductor to its shield. When this was done, the rather large signal still appeared on the scope during each discharge indicating that one was measuring the leakage through the coax shield and not the internal field.

Thus, as one can ascertain, what was occurring is that in an attempt to measure a rather feeble field of a few volts per inch within the shielded enclosure, one was actually measuring an enormous field of several thousand volts per inch on the other side of the shielded enclosure. Thus, as one can ascertain, this prior art approach created three immediate problems.

First, the coaxial cable would probably need a solid outer conductor to screen out the large static field. Second, the point where this coaxial cable breached the equipment housing would need such a good connection as to require modification of that equipment. Third, the coaxial shield would ground the enclosure and change the nature of the test discharge unless special longitudinal inductance (ferrite and so on) were placed in that path. The above-noted probe eliminated all the problems.

As one can understand, the probe provides extreme isolation because the optical fiber itself does not measure the field. No intrusive wires are needed because the remote end is battery powered. High gain is provided by the various amplifying configurations which drive the LED on the sensing end. On the near end, one can employ an oscilloscope in lieu of the detector and preamplifier as oscilloscopes are very well shielded and do not erroneously respond to high fields. In any event, the fiber preamplifier which couples this probe to the scope requires special shielding even when mounted directly on the scope's vertical input connector.

Hence, the use of an optical fiber allows the preamp and detector, as module 24, to be moved many feet from the test area if the high local field is a problem. As one can ascertain, the probe is extremely effective in performing measurements of RF electromagnetic fields and extremely useful in testing equipment which are subjected to ESD interference.

It will be therefore apparent to one skilled in the art that many modifications and alterations are possible, all of which lie within the spirit and scope of the claims as appended hereto.

I claim:

1. A field probe apparatus for measuring relatively weak RF electromagnetic fields generated within shielded enclosures and operative to minimumly disturb said fields, comprising:

a sensing conductor means adapted to be inserted into said enclosure to provide a signal indicative of electromagnetic field strength;
amplifier means having an input coupled to said conductor means and operative to provide a voltage to current conversion gain at an output;
a light emitting device coupled to said amplifier output to provide a light signal according to the signal produced on said sensing conductor means; and
an optical fiber cable having a first end positioned to receive said light signal from said emitting device to transport said light signal to a second end of said fiber,
wherein said amplifier means includes a source of operating potential, transistor means having main electrodes coupled to said source of operating potential and a control electrode coupled to said sensing conductor means, and further circuit elements coupled to said transistor means and having output terminals for providing a current output to said light emitting device,
said light emitting device being a light emitting diode (LED) having its anode and cathode coupled to said output terminals of said amplifier means, and said transistor means and other coupled circuit elements thereof having a very high input impedance at said control electrode and providing a very high voltage-to-current gain at said output terminals, such that relatively weak RF electromagnetic fields sensed by said sensing conductor means result in a current output sufficient to drive said LED, wherein said light emitted by said LED varies according to the signal provided by said sensing conductor means for applying said light signal to said first end of said optical fiber cable.

2. The field probe apparatus according to claim 1 further including:
preamplifying means optically coupled to said fiber at said second end for amplifying said optical signal as transmitted by said optical fiber.

3. The field probe apparatus according to claim 2 wherein said preamplifying means includes a light responsive diode positioned near said second end of said optical fiber a transimpedance amplifier having an input coupled to said diode and operative to provide an amplified output signal at said output.

4. The field probe apparatus according to claim 3 further including a shielded housing enclosing said preamplifying means said housing having an aperture into which said second end of said optical fiber cable is inserted.

5. The field probe apparatus according to claim 3 wherein said light responsive diode is a PIN diode.

6. The field probe apparatus according to claim 1 wherein said sensing conductor means is a length of wire capable of responding to an electric field.

7. The field probe apparatus according to claim 1 further including a shielded housing enclosing said amplifier means, said light emitting device and having a first opening for accommodating said other end of said sensing conductor means and a second opening for receiving said first end of said optical fiber cable to enable said first end of said cable to be positioned in close proximately to said light emitting device.

8. The field probe apparatus according to claim 7 further including a battery located in said housing for providing an operating potential for said amplifier and said light emitting device.

9. A field probe apparatus for measuring RF electromagnetic fields generated within shielded enclosures and operative to minimumly disturb said fields, comprising:
  a sensing conductor means adapted to be inserted into said enclosure to provide a signal indicative of electromagnetic field strength;
  amplifier means having an input coupled to said conductor means and operative to provide a voltage to current conversion gain at an output;
  a light emitting device coupled to said amplifier output to provide a light signal according to the signal produced on said sensing conductor means; and
  an optical fiber cable having a first end positioned to receive said light signal from said emitting device to transport said light signal to a second end of said fiber,
  wherein said amplifier means includes a FET having the gate electrode coupled to said sensing conductor means with the source electrode coupled to a point of reference potential and having a drain output electrode adapted to be coupled to a point of operating potential;
  a transistor having the base electrode coupled to said drain output electrode and having an emitter electrode adapted to be coupled to said point of operating potential;
  a light emitting diode (LED) having its anode coupled to the collector electrode of said transistor with the cathode coupled to said source electrode of said FET, wherein said light emitted by said LED varies according to the signal provided by said sensing conductor means for applying said light signal to said first end of said optical fiber cable.

10. The field probe apparatus according to claim 9 wherein said FET is a JFET.

11. The field probe apparatus according to claim 9 wherein said FET is a MOSFET.

12. The field probe apparatus according to claim 9 wherein said transistor is a PNP transistor 13. A method of measuring relatively weak RF electromagnetic fields inside a shielded enclosure with minimum disturbance to said fields in said enclosure, comprising the steps of:
  inserting a probe tip into said enclosure, said probe tip consisting of a piece of wire, one end of which is coupled to a very high input impedance amplifier to provide an output current of very high voltage-to-current gain proportional to a voltage signal provided by the wire, wherein said probe is mounted external to said enclosure whose internal field is being measured;
  placing a light emitting device in series with said output current to provide a light signal indicative of said current;
  transmitting said light signal via a fiber optic cable to a remote location; and
  monitoring said transmitted signal at said remote location to determine the nature of said monitored fields.

14. The method according to claim 13 wherein said light emitting device is a light emitting diode (LED).

* * * * *